(12) United States Patent
Felton et al.

(10) Patent No.: US 9,436,234 B1
(45) Date of Patent: Sep. 6, 2016

(54) CONFIGURABLE SYSTEM BOARD

(71) Applicant: EMC Corporation, Hopkinton, MA (US)

(72) Inventors: Mickey S. Felton, Sterling, MA (US); Robert P. Wierzbicki, Worcester, MA (US); Michael Gregoire, Waltham, MA (US)

(73) Assignee: EMC Corporation, Hopkinton, MA (US)

( * ) Notice: Subject to any disclaimer, the term of this patent is extended or adjusted under 35 U.S.C. 154(b) by 221 days.

(21) Appl. No.: 14/042,551

(22) Filed: Sep. 30, 2013

(51) Int. Cl.
*H05K 1/11* (2006.01)
*H05K 1/14* (2006.01)
*G06F 1/18* (2006.01)

(52) U.S. Cl.
CPC ..................................... *G06F 1/185* (2013.01)

(58) Field of Classification Search
CPC ............................. G06F 3/0601; G06F 3/0625
USPC ...................... 361/679.32, 781, 784–786
See application file for complete search history.

(56) References Cited

U.S. PATENT DOCUMENTS

| | | |
|---|---|---|
| 2005/0102463 A1* | 5/2005 | Peil et al. .................. 710/316 |
| 2006/0184704 A1* | 8/2006 | Yu ............................. 710/300 |
| 2007/0067514 A1* | 3/2007 | Anderson et al. ........... 710/70 |
| 2010/0199011 A1* | 8/2010 | Chen et al. ................. 710/301 |
| 2014/0223064 A1* | 8/2014 | Wang ......................... 710/301 |
| 2015/0052275 A1* | 2/2015 | Maroney et al. ........... 710/301 |

* cited by examiner

*Primary Examiner* — Bernard Rojas
(74) *Attorney, Agent, or Firm* — Brian J. Colandreo; Mark H. Whittenberger; Holland & Knight LLP

(57) ABSTRACT

An IT device includes a system board and a riser card socket electrically coupled to the system board and configured to receive a riser card. At least one expansion card slot is electrically coupled to the system board and configured to receive at least one expansion card. A controller assembly is electrically coupled to the system board and configured to energize the at least one expansion card slot while the riser card socket is empty.

16 Claims, 3 Drawing Sheets

(top view)

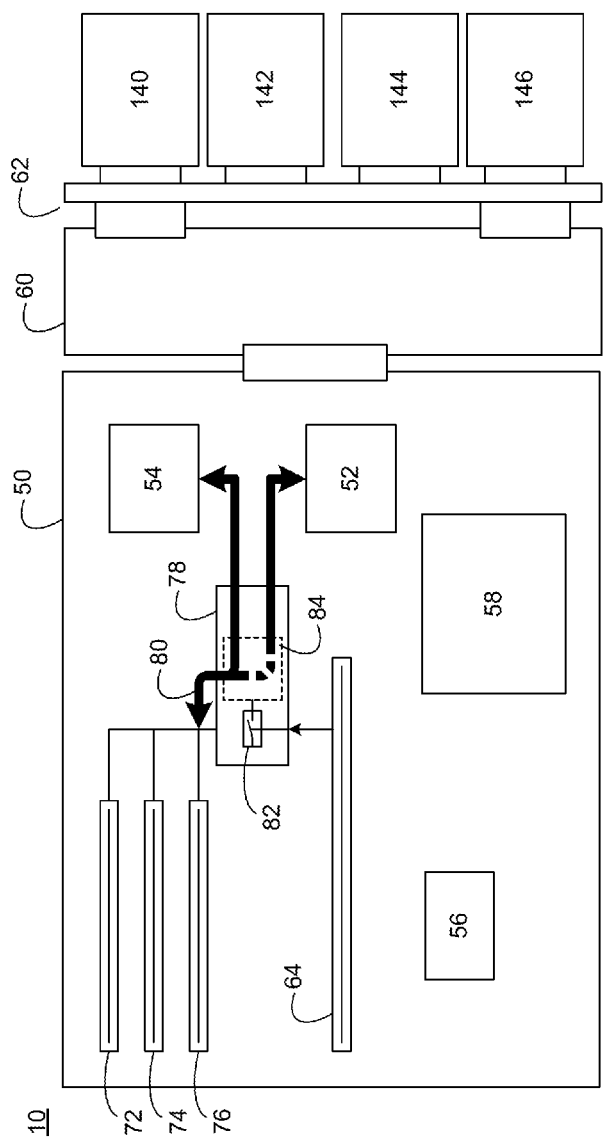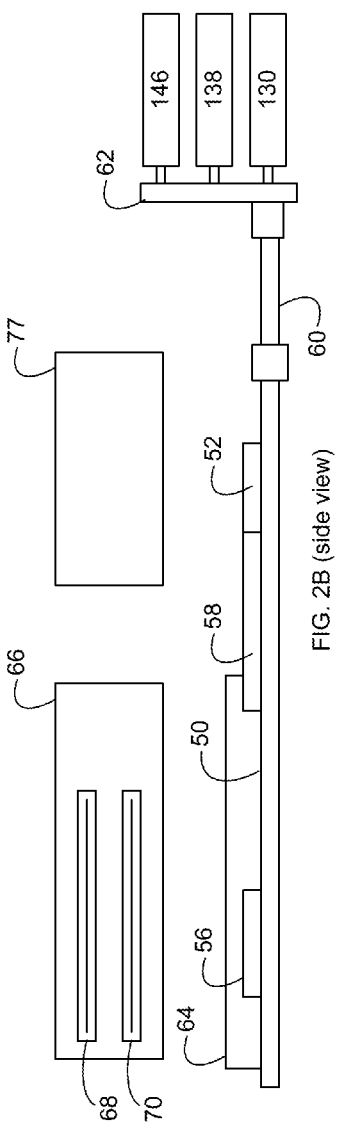

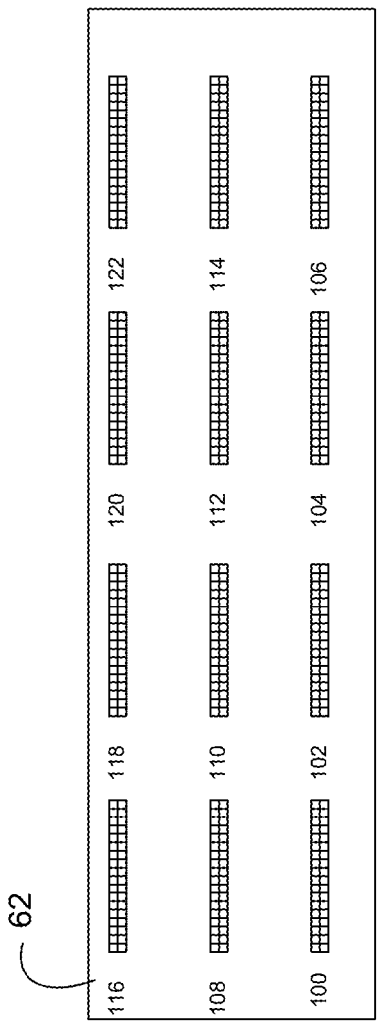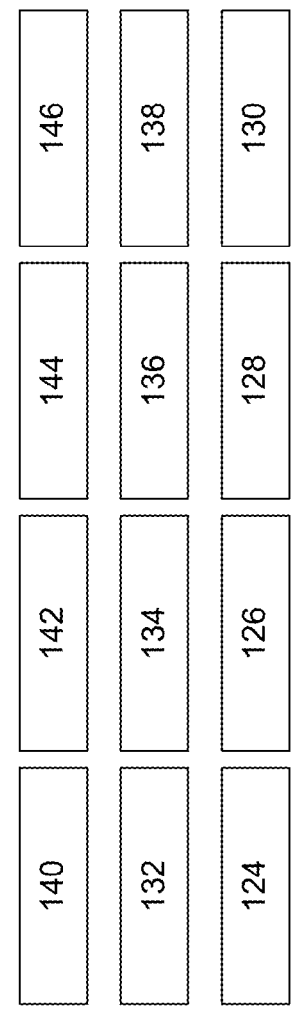

CONFIGURABLE SYSTEM BOARD

TECHNICAL FIELD

This disclosure relates to system boards and, more particularly, to configurable system boards for use in high availability devices.

BACKGROUND

In today's IT infrastructure, high availability is of paramount importance. Specifically, critical (and sometimes non-critical) components within an IT infrastructure are often layered in redundancy. For example, primary servers may be supported by backup servers; primary switches may be supported by backup switches; primary power supplies may be supported by backup power supplies; and primary storage systems may be supported by backup storage systems.

When designing such high availability devices, flexibility concerning the manner in which these devices are configured is highly important. Further, since enclosure space within these devices is at a premium, such configuration flexibility should be accompanied by spatial efficiency.

SUMMARY OF DISCLOSURE

In one implementation, an IT device includes a system board and a riser card socket electrically coupled to the system board and configured to receive a riser card. At least one expansion card slot is electrically coupled to the system board and configured to receive at least one expansion card. A controller assembly is electrically coupled to the system board and configured to energize the at least one expansion card slot while the riser card socket is empty.

One or more of the following features may be included. The at least one expansion card slot may include at least one PCI Express expansion card slot. The at least one expansion card slot may include two or more expansion card slots. The riser card may include two or more PCI Express expansion card slots. A drive controller system may be electrically coupled to the system board. A mid-plane assembly may be electrically coupled to the drive controller system. The mid-plane assembly may be configured to electrically couple the drive controller system to a plurality of disk drives. The controller assembly may be configured to route data to the at least one expansion card slot while the riser card socket is empty. The controller assembly may include a switch assembly coupled to the riser card socket. The switch assembly may include a transistor. The controller assembly may include a multiplexer electrically coupled to the switch assembly. The IT device may be configured for use in a high availability storage system.

In another implementation, an IT device includes a system board and a riser card socket electrically coupled to the system board and configured to receive a riser card. At least one expansion card slot is electrically coupled to the system board and configured to receive at least one expansion card. A controller assembly is coupled to the system board and configured to energize the at least one expansion card slot while the riser card socket is empty. The controller assembly may include a switch assembly coupled to the riser card socket and a multiplexer electrically coupled to the switch assembly.

One or more of the following features may be included. The at least one expansion card slot may include at least one PCI Express expansion card slot. The riser card may include two or more PCI Express expansion card slots. The IT device may be configured for use in a high availability storage system.

In another implementation, an IT device includes a system board and a riser card socket electrically coupled to the system board and configured to receive a riser card. At least one PCI Express expansion card slot is electrically coupled to the system board and configured to receive at least one expansion card. A controller assembly is coupled to the system board and configured to energize the at least one expansion card slot while the riser card socket is empty.

One or more of the following features may be included. A drive controller system may be electrically coupled to the system board. A mid-plane assembly may be electrically coupled to the drive controller system. The mid-plane assembly may be configured to electrically couple the drive controller system to a plurality of disk drives. The IT device may be configured for use in a high availability storage system.

The details of one or more implementations are set forth in the accompanying drawings and the description below. Other features and advantages will become apparent from the description, the drawings, and the claims.

BRIEF DESCRIPTION OF THE DRAWINGS

FIGS. 2A & 2B are diagrammatic views of a system board, drive controller system, and mid-plane assembly included within the IT device of FIG. 1;

FIG. 2C is a diagrammatic view of the mid-plane assembly of FIGS. 2A & 2B; and FIG. 2D is a diagrammatic view of a drive array for electrically coupling to the mid-plane assembly of FIGS. 2A, 2B & 2C.

Like reference symbols in the various drawings indicate like elements.

DETAILED DESCRIPTION OF THE PREFERRED EMBODIMENTS

Figure 1:
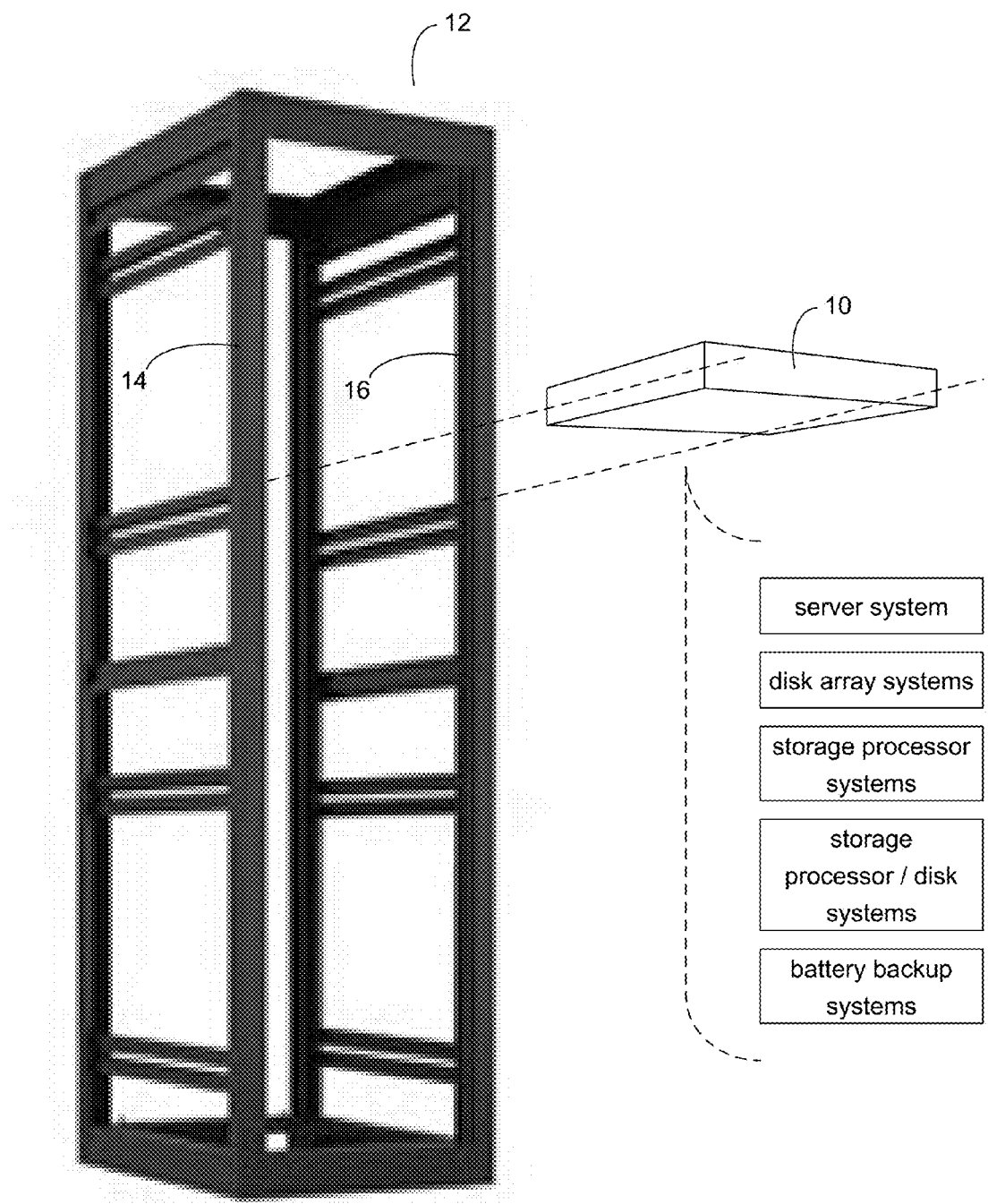
FIG. 1 is a perspective view of an IT rack and an IT device.

Referring to FIG. 1, IT devices (e.g., IT device 10) may be utilized by organizations to process and store data. Examples of IT device 10 may include but are not limited to the various components of high-availability storage systems, such as: server systems, disk array systems, storage processor systems, storage processor/disk systems, and battery backup systems.

IT racks (e.g., IT rack 12) may be utilized to store and organize these IT devices (e.g., IT device 10). For example, IT rack 12 may be placed within a computer room and various IT devices may be attached to rails (e.g., NEMA rails 14, 16) included within IT rack 12, wherein these rails (e.g., NEMA rails 14, 16) may have a standard and defined spacing between them (e.g., 19"). Typically, IT devices that are configured to fit within IT rack 12 may be described as rack-mountable IT devices. Alternatively. IT device 10 may be a free-standing device that does not require an IT rack for mounting.

Referring also to FIGS. 2A, 2B, 2C & 2D, positioned within IT device 10 may be one or more system boards (e.g., system board 50) that may include a plurality of circuits 52, 54, 56, 58, examples of which may include but are not limited to one or more microprocessors, memory circuits, voltage regulator circuits, and memory controller circuits.

IT device 10 may include a drive controller system (e.g., drive controller system 60) that may be electrically coupled to system board 50. A mid-plane assembly (e.g., mid-plane assembly 62) may be electrically coupled to drive controller system 60. Mid-plane assembly 62 may include a plurality of drive connectors (e.g., drive connectors 100, 102, 104, 106, 108, 110, 112, 114, 116, 118, 120, 122) that are configured to electrically couple mid-plane assembly 62 to a plurality of disk drives (e.g., disk drives 124, 126, 128, 130, 132, 134, 136, 138, 140, 142, 144, 146 respectively), Disk drives 124, 126, 128, 130, 132, 134, 136, 138, 140, 142, 144, 146 may be hot-swappable disk drives that may be coupled to and/or decoupled from mid-plane assembly 62 during the operation of IT device 10. While, in this example, mid-plane assembly 62 is shown to accommodate twelve disk drives, this is for illustrative purposes only, as the actual number of disk drives may be increased/decreased based upon design criteria.

IT device 10 may further include a riser card socket (e.g., riser card socket 64) electrically coupled to system board 50 and configured to receive a riser card (e.g., riser card 66). Riser card 66 may be configured to include two or more PCI Express expansion card slots (e.g., PCI Express expansion card slots 68, 70). Riser card 66 may be an optional card for IT device 10 that may allow for the utilization of PCI Express expansion cards within IT device 10.

As discussed above, IT device 10 may include one or more system boards (e.g., system board 50) that may include a plurality of circuits 52, 54, 56, 58, wherein examples of these circuits may include but are not limited to one or more microprocessors, memory circuits, voltage regulator circuits, and memory controller circuits. Assume for illustrative purposes that (in this example) IT device 10 includes two microprocessors (e.g., circuit 52 and circuit 54), wherein the first microprocessor (e.g., circuit 52) is the standard microprocessor and the second microprocessor (e.g., circuit 54) is an optional second microprocessor (to create a dual processor system). Further, assume that when you choose the dual microprocessor option (i.e., to have both circuit 52 and circuit 54 installed within IT device 10), one or more expansion card slots (e.g., expansion card slots 72, 74, 76) that are electrically coupled to system board 50 and configured to receive at least one expansion card (e.g., expansion card 77) may be accessible to the second microprocessor (e.g., circuit 54).

Accordingly, while expansion card slots 72, 74, 76 may be included on system board 50 regardless of whether IT device 10 includes a single microprocessor (e.g., circuit 52) or dual microprocessors (e.g., circuits 52, 54), expansion card slots 72, 74, 76 may be configured to only be usable and accessible by the second microprocessor (e.g., circuit 54). Accordingly, in the event that IT device 10 does not include the second microprocessor (e.g., circuit 54), expansion card slots 72, 74, 76 may be inaccessible by the first microprocessor (e.g., circuit 52).

When IT device 10 is configured in such a fashion (i.e., IT device 10 includes only one microprocessor (e.g., circuit 52) and, therefore, expansion card slots 72, 74, 76 are not available to/accessible by the microprocessor (e.g., circuit 52)), IT device 10 may be required to include (optional) riser card 66 in order to allow for the utilization of PCI Express expansion cards within IT device 10, as riser card 66 is shown (in this example) to include two expansion card slots (e.g., PCI Express expansion card slots 68, 70).

In order to avoid the situation in which IT device 10 must include a riser card (e.g., riser card 66) in order for the microprocessor (e.g., circuit 52) to access one or more of expansion card slots 72, 74, 76, IT device 10 may include a controller assembly (e.g., controller assembly 78) electrically coupled to system board 50 and configured to energize at least one of the expansion card slots (e.g., expansion card slots 72, 74, 76) whenever riser card socket 64 is empty (e.g., not occupied).

Accordingly, controller assembly 78 may be configured to route data (e.g., data 80) to at least one expansion card slot (e.g., expansion card slot 76) while riser card socket 64 is empty (e.g., not occupied). While the following disclosure concerns only one expansion card slot (e.g., expansion card slot 76) being energized while riser card socket 64 is empty (e.g., not occupied), this is for illustrative purposes only, as other configurations are possible and are considered to be within the scope of this disclosure. For example, controller assembly 78 may be configured to route data (e.g., data 80) to all expansion card slots (e.g., expansion card slot 72, 74, 76) while riser card socket 64 is empty (e.g., not occupied).

Controller assembly 78 may include switch assembly 82 (e.g., a transistor) coupled to riser card socket 64. The status of one or more conductors within riser card socket 64 (which may transition from a low state to a high state (or visa versa) during the installation/removal of riser card 66 from riser card socket 64), may be used to energize (or deenergize) switch assembly 82. Once energized (or deenergized) switch assembly 82 (which may be electrically coupled to multiplexer 84), may configure multiplexer 84 so that expansion card slot 76 is electrically coupled to the first microprocessor (e.g., circuit 52). Accordingly, the first microprocessor (e.g., circuit 52) may be capable of utilizing an expansion card positioned within expansion card slot 76.

Having thus described the disclosure of the present application in detail and by reference to embodiments thereof, it will be apparent that modifications and variations are possible without departing from the scope of the disclosure defined in the appended claims.

What is claimed is:

1. An IT device comprising:
   a system board;
   a riser card socket electrically coupled to a first processor on the system board and configured to receive a riser card;
   at least one expansion card slot electrically coupled to a second processor on the system board and configured to receive at least one expansion card;
   a controller assembly electrically coupled to the system board and configured to electrically couple the at least one expansion card slot to the first processor when the riser card socket is empty;
   a drive controller system electrically coupled to the system board; and
   a mid-plane assembly electrically coupled to the drive controller system.

2. The IT device of claim 1 wherein the at least one expansion card slot includes at least one PCI Express expansion card slot.

3. The IT device of claim 1 wherein the at least one expansion card slot includes two or more expansion card slots.

4. The IT device of claim 1 wherein the riser card includes two or more PCI Express expansion card slots.

5. The IT device of claim 1 wherein the mid-plane assembly is configured to electrically couple the drive controller system to a plurality of disk drives.

6. The IT device of claim 1 wherein the controller assembly is configured to route data to the at least one expansion card slot while the riser card socket is empty.

7. The IT device of claim 6 wherein the controller assembly includes a switch assembly coupled to the riser card socket.

8. The IT device of claim 7 wherein the switch assembly includes a transistor.

9. The IT device of claim 7 wherein the controller assembly includes a multiplexer electrically coupled to the switch assembly.

10. The IT device of claim 1 wherein the IT device is configured for use in a high availability storage system.

11. An IT device comprising:
   a system board;
   a riser card socket electrically coupled to a first processor on the system board and configured to receive a riser card;
   at least one expansion card slot electrically coupled to a second processor on the system board and configured to receive at least one expansion card;
   a controller assembly electrically coupled to the system board and configured to:
      electrically couple the at least one expansion card slot to the first processor when the riser card socket is empty; and
      route data to the at least one expansion card slot while the riser card socket is empty;
   wherein the controller assembly includes a switch assembly coupled to the riser card socket and a multiplexer electrically coupled to the switch assembly.

12. The IT device of claim 11 wherein the at least one expansion card slot includes at least one PCI Express expansion card slot.

13. The IT device of claim 11 wherein the riser card includes two or more PCI Express expansion card slots.

14. The IT device of claim 11 wherein the IT device is configured for use in a high availability storage system.

15. An IT device comprising:
   a system board;
   a riser card socket electrically coupled to a first processor on the system board and configured to receive a riser card;
   at least one PCI Express expansion card slot electrically coupled to a second processor on the system board and configured to receive at least one expansion card;
   a controller assembly electrically coupled to the system board and configured to electrically couple the at least one expansion card slot to the first processor when the riser card socket is empty;
   a drive controller system electrically coupled to the system board; and
   a mid-plane assembly electrically coupled to the drive controller system, wherein the mid-plane assembly is configured to electrically couple the drive controller system to a plurality of disk drives.

16. The IT device of claim 15 wherein the IT device is configured for use in a high availability storage system.

* * * * *